United States Patent
Ravnkilde et al.

(10) Patent No.: US 7,489,837 B2
(45) Date of Patent: Feb. 10, 2009

(54) OPTICAL MICROELECTROMECHANTICAL STRUCTURE

(75) Inventors: Jan Tue Ravnkilde, Hedehusene (DK); Henning Henningsen, Låsby (DK)

(73) Assignee: Huntsman Advanced Materials Americas Inc., The Woodlands, TX (US)

( * ) Notice: Subject to any disclaimer, the term of this patent is extended or adjusted under 35 U.S.C. 154(b) by 70 days.

(21) Appl. No.: 10/559,310

(22) PCT Filed: Jun. 6, 2003

(86) PCT No.: PCT/DK03/00372

§ 371 (c)(1), (2), (4) Date: Apr. 7, 2006

(87) PCT Pub. No.: WO2004/108588

PCT Pub. Date: Dec. 16, 2004

(65) Prior Publication Data

US 2006/0228066 A1    Oct. 12, 2006

(51) Int. Cl.
*G02B 6/12* (2006.01)

(52) U.S. Cl. .......................................... 385/14; 385/18
(58) Field of Classification Search .................. 385/14, 385/18
See application file for complete search history.

(56) References Cited

U.S. PATENT DOCUMENTS

| | | | |
|---|---|---|---|
| 6,400,009 B1 * | 6/2002 | Bishop et al. ................ | 257/704 |
| 6,808,955 B2 * | 10/2004 | Ma .............................. | 438/51 |
| 7,003,192 B2 * | 2/2006 | Blair et al. ..................... | 385/18 |
| 7,008,812 B1 * | 3/2006 | Carley .......................... | 438/52 |
| 2003/0038327 A1 * | 2/2003 | Smith .......................... | 257/415 |

* cited by examiner

*Primary Examiner*—Quyen P Leung

(57) ABSTRACT

The invention relates to an optical microelectromechanical structure (MEMS) comprising—an (at least one) optically transmissive layer (UTL)—an (at least one) intermediate layer structure (IL)—a (at least one) device layer (DL) said intermediate layer structure (IL) defining one or more optical paths (OP) between said substantially optically transmissive layer (UTL) and said device layer (DL), said intermediate structure layer (IL) defining the distance (d) between said optically transmissive layer (UTL) and said device layer (DL).

32 Claims, 6 Drawing Sheets

OPTICAL MICROELECTROMECHANTICAL STRUCTURE

CROSS REFERENCE TO RELATED APPLICATIONS

This application is the National Phase of International Application PCT/DK2003/000372 filed Jun. 6, 2003 which designated the U.S. The noted application is incorporated herein by reference.

FIELD OF THE INVENTION

The invention relates to an optical microelectromechanical structure (MEMS) and a method of manufacturing a microelectromechanical structure (MEMS).

BACKGROUND OF THE INVENTION

Several different types of optical MEMS devices are known within the art.

A problem related to prior art optical MEMS devices, such as transmissive microshutter-based spatial light modulators (SLM) is that the various optical components of the individual microshutters must be arranged in mutually very well-defined positions in order to obtain the desired optical characteristics, e.g. of an optical path through the microshutter arrangement. Even small misalignments or variations in the mutual positioning between the optical components may result in reduced transmission.

A further problem of the optical transmissive microshutter MEMS devices is that moving parts of the devices typically must be encapsulated in order to reduce influence from e.g. dust and humidity. This encapsulation is often obtained by encapsulating the complete mechanical system between the input and the output optics, e.g. micro lenses. One way of encapsulation is obtained by applying so-called spacer glue in order to obtain the necessary distance between the micro lenses and the other structural parts and subsequently applying a surrounding sealing. A problem related to this encapsulation is, however, that the prior art encapsulation process is expensive and not always sufficient for obtaining a reliable end product.

It is an object of the invention to provide a well-defined positioning of the optical components of an optical MEMS device.

It is a further object of the invention to provide an optical MEMS device, in particular an optically transmissive MEMS device having improved properties with respect to sealing.

SUMMARY OF THE INVENTION

The invention relates to an optical microelectromechanical structure (MEMS) comprising at least one optically transmissive layer (UTL)
at least one intermediate layer structure (IL)
at least one device layer (DL)

said intermediate layer structure (IL) facilitating transmission of light between said substantially optically transmissive layer (UTL) and said device layer (DL), said intermediate structure layer (IL) defining the distance (d) between said optically transmissive layer (UTL) and said device layer (DL).

The invention relates to an optical microelectromechanical structure (MEMS) comprising at least one optically transmissive layer (UTL)
at least one intermediate layer structure (IL)
at least one device layer (DL)

said intermediate layer structure (IL) facilitating one or more optical paths (OP) between said substantially optically transmissive layer (UTL) and said device layer (DL), said intermediate structure layer (IL) defining the distance (d) between said optically transmissive layer (UTL) and said device layer (DL).

In an embodiment of the invention, the intermediate layer structure (IL) comprises at least one electrically insulating layer.

In an embodiment of the invention, the intermediate layer structure (IL) comprises at least one sub-layer.

In an embodiment of the invention, the at least one of said sub-layers comprises an electrically insulating layer.

In an embodiment of the invention, said intermediate layer structure (IL) comprises one unitary layer structure.

In an embodiment of the invention, said single layer structure comprises a plate structure having at least one opening means forming part of said at least one optical path (OP). The opening means are established by spatial structuring of the intermediate layer, whereby the intermediate layer structure is obtained.

In an embodiment of the invention, said at least one opening means comprises at least one optical path (OP).

In an embodiment of the invention, said at least one opening means comprises at least one aperture (AP).

In an embodiment of the invention, said at least one opening means comprises a plurality of apertures (AP) each forming part of one individual optical path (OP)

In an embodiment of the invention, said intermediate layer structure (IL) comprises at least one layer structure.

In an embodiment of the invention, said plurality of layer structures comprises columns.

In an embodiment of the invention, said device layer (DL) is attached to a base layer (BL).

In an embodiment of the invention, the extent of the shortest individual optical paths (OP) between the optically transmissive layer (UTL) and the device layer substantially equals the thickness of said intermediate layer.

In an embodiment of the invention, the extent of the shortest individual optical paths (OP) between the optically transmissive layer (UTL) and the base layer (BL) substantially equals the thickness of the combined intermediate layer structure and said base layer in combination.

In an embodiment of the invention, said base layer (BL) is optically transmissive.

In an embodiment of the invention, said base layer (BL) is optically non-transmissive and provided with through-holes.

In an embodiment of the invention, said base layer (BL) comprises further apertures corresponding to said apertures (AP) and providing a corresponding number of optical paths (OP)

In an embodiment of the invention, said device layer (DL) comprises movable parts of actuators.

In an embodiment of the invention, said intermediate layer structure (IL) comprises at least two separated mutually joined layers, at least one of said mutually joined layers comprising an electrically insulating layer and at least one of said mutually joined layers comprising a further layer.

In an embodiment of the invention, said intermediate layer structure (IL) comprises a handle layer and an insulating layer of an SOI wafer.

In an embodiment of the invention, said optical microelectromechanical structure (MEMS) comprises a sealed package.

In an embodiment of the invention, the sealing is partly comprised by said optically transmissive layers.

In an embodiment of the invention, said substantially transmissive layer comprises micro lenses.

In an embodiment of the invention, said base layer (BL) comprises micro lenses.

In an embodiment of the invention, said layers are mutually joined.

The layers may e.g. be mutually joined by means of a suitable bonding process depending on the materials involved.

In an embodiment of the invention, the layers of the microelectromechanical optical structure (MEMS) are plane layers.

In an embodiment of the invention, said intermediate layer structure comprises silicon oxide, silica, quartz, glass, aluminum, sapphire, silicon, nickel or other metals, PMMA or other polymers and/or combinations thereof.

In an embodiment of the invention, at least one of the optically transmissive layers preferably comprises Pyrex glass, quartz, silica, aluminum, sapphire, silicon, PMMA or other polymers and/or combinations thereof.

In an embodiment of the invention, said device layer (DL) comprises silicon of any doping, nickel or other metals or preferably silicon of high doping level.

In an embodiment of the invention, said insulating layer comprises silica, quartz, glass, aluminum, sapphire, silicon nitride, PMMA or other polymers preferably silicon oxide and/or combinations thereof.

In an embodiment of the invention, the optical MEMS device comprises at least one light modulator arrangement, preferably formed in said device layer (DL), said at least one light modulator arrangement comprising at least one movable microshutter having at least one open and at least one closed position, where said at least one optical path guides light through the optical MEMS device via said at least one light modulator arrangement, and where the MEMS device further comprises electrical connections adapted for transmission of electrical control signals to and optionally from said at least one light modulator arrangement.

In an embodiment of the invention, the light transmitted in the at least one optical path (OP) is focused in or in the vicinity of the shutter plane of said at least one light modulator.

Moreover, the invention relates to a method of manufacturing an optical microelectromechanical structure (MEMS) on the basis of at least at least one optically transmissive layer (UTL)

at least one intermediate layer structure (IL)

at least one device layer (DL)

whereby optical transmission is facilitated between said optically transmissive layer (UTL) and said device layer (DL) by removal of at least a part of the intermediate layer structure (IL) and whereby the distance between said transmissive layer (UTL) and said device layer (DL) is defined by the thickness of said intermediate layer structure.

In an embodiment of the invention, structural parts of the optical MEMS device is formed by etching of said device layer (DL).

In an embodiment of the invention, said intermediate layer structure (IL) comprising at least one electrically insulating layer, whereby structural parts of the MEMS device is formed by etching of said device layer (DL) and whereby a transmission of light is facilitated between said optically transmissive layer (UTL) and said device layer (DL) by removal of at least a part of said intermediate layer structure (IL).

In an embodiment of the invention, said intermediate layer structure (IL) comprising at least one electrically insulating layer, whereby structural parts of the optical MEMS device is formed by etching of said device layer (DL) and whereby at least one optical path is provided in said optically transmissive layer (UTL) and said device layer (DL) by partly removal of said intermediate layer structure (IL).

In an embodiment of the invention, said removal is performed by etching of the intermediate layer structure (IL).

In an embodiment of the invention, whereby said optical MEMS layers are mutually joined.

THE DRAWINGS

The invention will be described below with reference to the figures, where

FIGS. 1A and 1B illustrate the basic structure of an embodiment of the invention, FIGS. 1C and 1D illustrate the basic structure of a further embodiment of the invention, FIGS. 1E and 1F illustrate the basic structure of a further embodiment of the invention, FIG. 2A-E illustrate a method of manufacturing an optical MEMS device according to an embodiment of the invention, FIG. 3-6 illustrate various embodiments of the invention, and where FIG. 7 illustrates a specific example of a microshutter according to the invention.

DETAILED DESCRIPTION

FIG. 1A illustrates a cross-section CS of a simplified optical microelectromechanical structure (MEMS) as illustrated from above in FIG. 1B.

The illustrated principle structure is a so-called optical microelectromechanical structure (MEMS) formed in a number of layers; an optically transmissive layer UTL separated from an optically transmissive base layer BL by means of an intermediate layer structure IL and a device layer DL.

The intermediate layer structure IL is basically electrically insulated with respect to electrically conductive parts of DL. The insulating performance may e.g. be obtained by the complete structure or partly by applying a separate insulating layer, e.g. between a part of the intermediate layer structure being electrically conductive and the device layer DL.

The intermediate layer structure IL defines the distance d between the transmissive layer UTL and the device layer DL and the intermediate layer structure IL comprises a number of apertures AP forming optically paths OP e.g. in the direction of the illustrated arrow.

It is noted that the fragile mechanical moving parts formed in the device layer DL, e.g. shutters 10, are encapsulated, in this embodiment individually, thereby featuring an advantageous sealing. Moreover, the optical paths OP between the base layer BL, and the upper transmissive layer UPL are well defined with the thickness of the applied layers. Moreover, due to the utilization of an intermediate layer structure having relatively solid structure, a mechanically more stable structure is obtained.

Figure 1A:
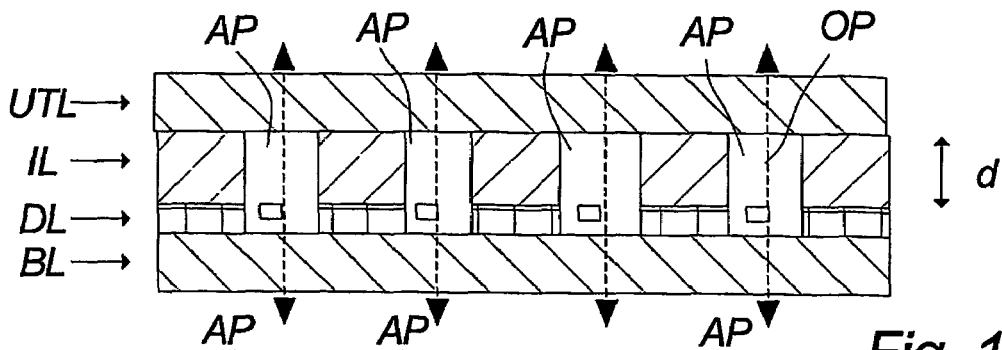
FIG. 1A and FIG. 1B illustrate the principle components of an embodiment of the invention.
Figure 1B:
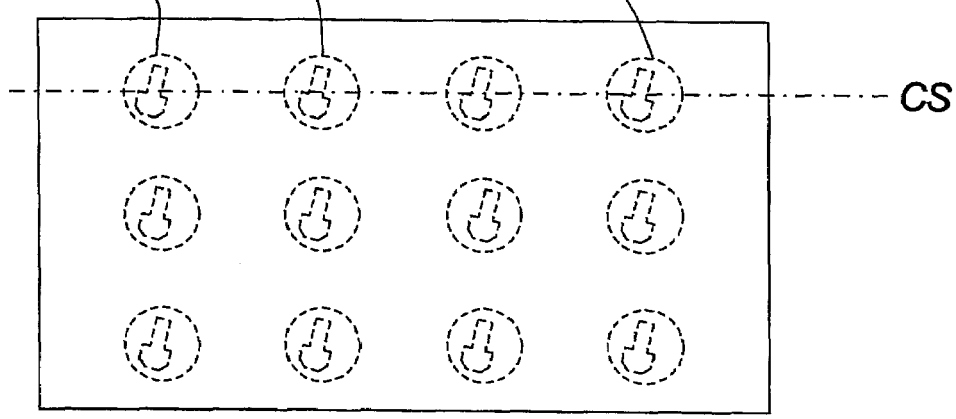
Figure 1C:
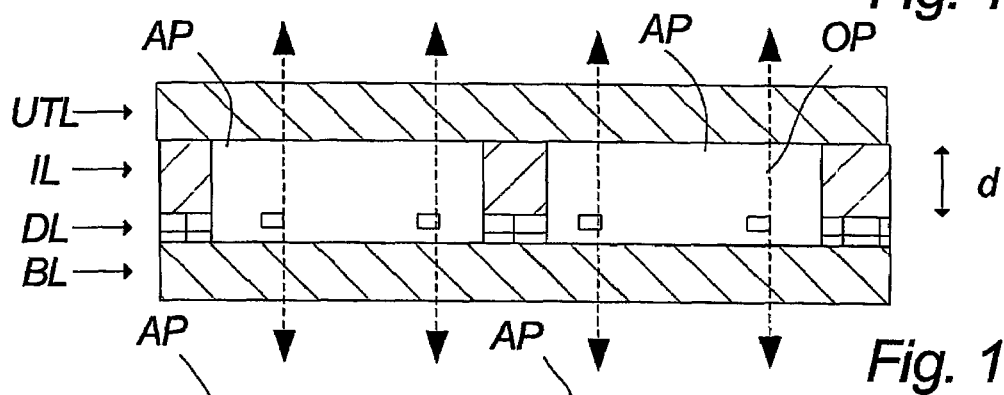
Figure 1D:
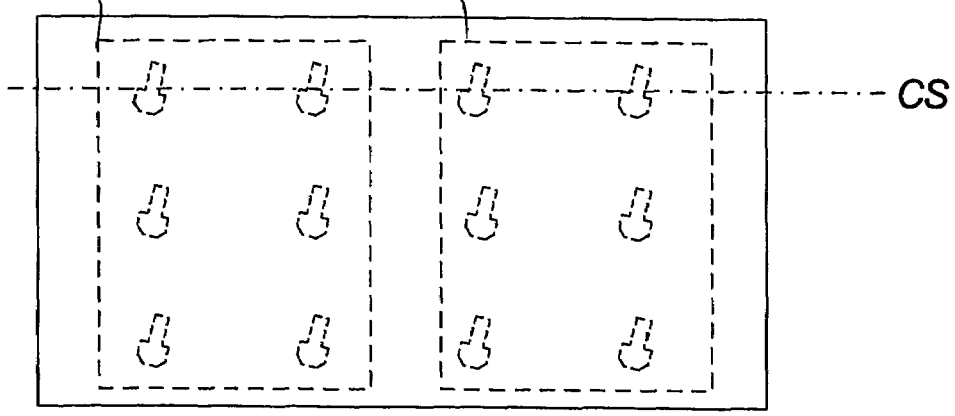

FIG. 1C and FIG. 1D illustrate the principle components of an embodiment of the invention.

FIG. 1C illustrates a cross-section CS of a simplified optical microelectromechanical structure (MEMS) as illustrated from above in FIG. 1D.

The illustrated embodiment corresponds to the embodiment of FIG. 1A and FIG. 1B but differs in the construction of the apertures. In this illustrated embodiment the MEMS device comprises only two cavities AP, each comprising six light modulating arrangements, of which only the movable shutter blade is illustrated. Still, it is noted that a well-defined distance between the layers, including the device layer, is obtained.

The above illustrated intermediate layer structures are so called unitary layer structures.

Figure 1E:
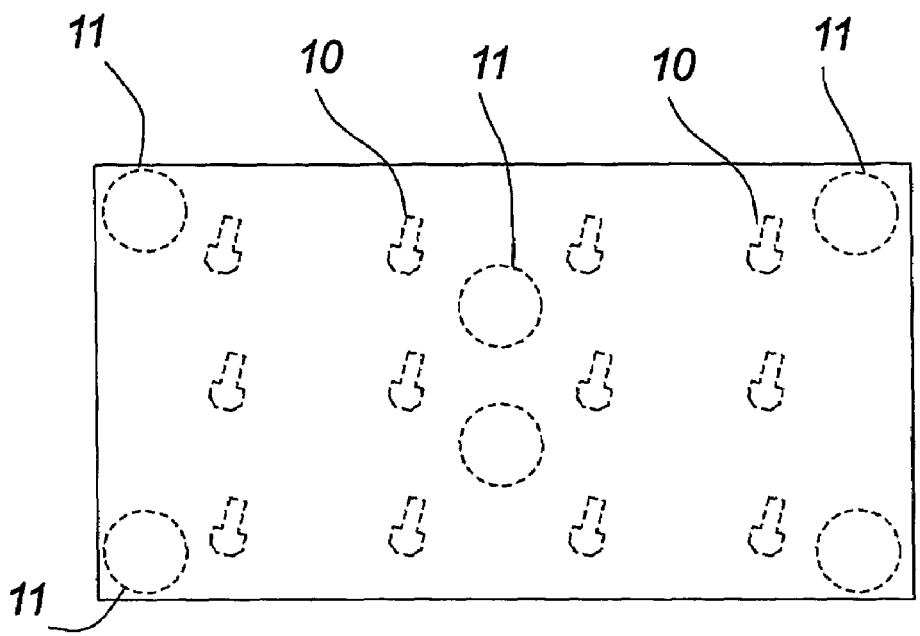
Figure 1F:
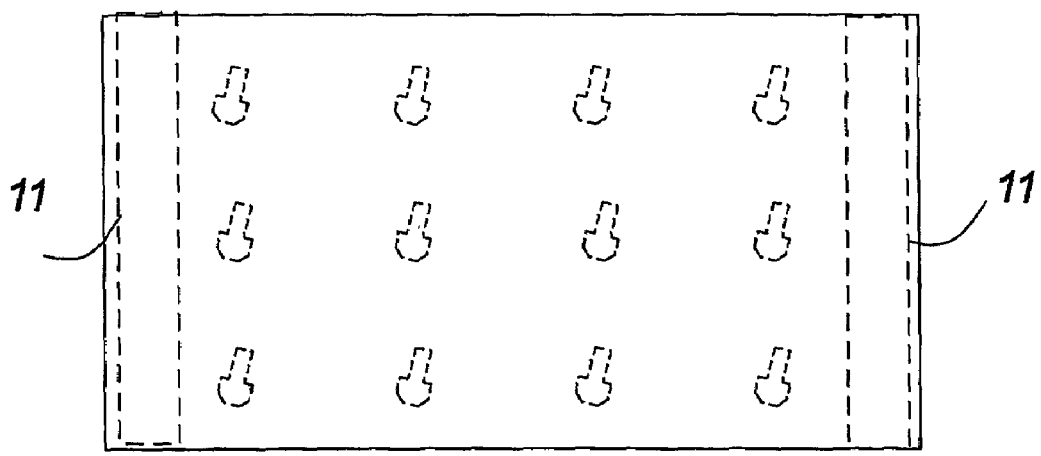

Many other cavity structures are applicable within the scope of the invention. Examples of such structures are illustrated in FIG. 1E and FIG. 1F as seen from above. For the purpose of simplifying the explanation a cross-section basically is as described an illustrated in FIG. 1A.

In FIG. 1E, the basic mechanical structure connecting the upper optically transmissive layer to the base layer BL comprises six pillar-like structures 11. The illustrated pillars basically form an intermediate layer structure providing a well-defined distance between the base layer and/or the device layer and the upper transmissive layer. In the illustrated embodiment a further circumference sealing must typically be applied, and the positioning of this sealing is typically a rather complicated process compared to the previous described embodiment, where the provided optical paths between the transmissive layer UTL and the device layer DL are basically encapsulated by the intermediate layer structure IL, the transmissive layer UTL and the base layer BL in combination. This is due to the fact that a sealing process is somewhat more difficult when dealing with optical paths facilitated by open-space structures.

In FIG. 1F, a further embodiment is disclosed, where the intermediate layer structure comprises two beam-like structures 11.

The above-illustrated intermediate layer structures are all preferably provided by etching or other material reduction techniques of an initial intermediate layer structure comprising one or further sub-layers.

FIG. 2A-2E illustrate a method of providing an optical MEMS device according to an embodiment of the invention.

Figure 2A:
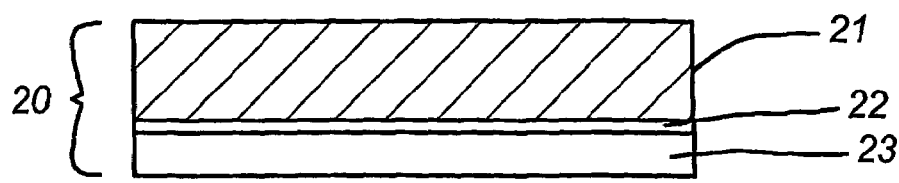

In FIG. 2A, a so-called silicon on insulator (SOI) wafer 20 has been provided. The illustrated SOI comprises a handle layer 21. Other SOI structures may be applied within the scope of the invention.

The handle layer 21 may preferably be silicon of any doping. Alternative materials may e.g. be silicon oxide, silica, quartz, glass, aluminum, sapphire PMMA or other polymers and/or combinations thereof. Typically, the function of a handling layer is to provide handling during processing.

The thickness is typically well defined within a range of 10-1000 micrometer, preferably 50-300 micrometer.

Moreover, the initial SOI wafer 20 comprises a device layer 23. The device layer preferably comprises silicon of high doping level. Alternative materials may e.g. comprise silicon of any doping, nickel or other metals. The function of the device layer is to form an electrically conductive layer and/or mechanical material for moving elements.

The preferred device substrate is formed by a device layer of SOI wafer having a well-controlled thickness within a range of 2-200 micrometer, preferably 5-30 micrometer.

The device layer 23 is separated from the handle layer 21 by means of an insulating layer 22. The insulating layer 22 is preferably made of silicon oxide. Alternative materials may e.g. be silica, quartz, glass, aluminum, sapphire, PMMA or other polymers, silicon nitride and/or combinations thereof.

The thickness must be very well defined for many reasons, e.g. in the range 0.1-3 micrometer.

It should be in this context be noted that the function of the handle layer 21 and the insulating layer 22, according to an embodiment of the invention, may be provided by a single layer if for instance the electrically insulation is actually obtained by means of the properties of the handle layer itself.

Such an embodiment may also be obtained by using e.g. a silicon-on-sapphire (SOS) wafer.

The handle layer 21 and the insulating layer 22 may also in this application be referred to as an intermediate layer structure as explained with reference to FIG. 1A-1F.

Moreover, a transmissive layer 24 formed by an optically transmissive substrate is provided. The layer preferably comprises Pyrex glass. Alternative materials may for example comprise similar glass types as Pyrex, quartz, silica, aluminum, sapphire, silicon PMMA or other polymers or other suitable materials. The preferred materials are suitable for anodic bonding, which is typically applied in the present embodiment when attaching the transmissive layer 24 to the wafer layers 21, 22 and 23. Other bonding techniques may be applied, such as eutectic bonding, glass fritt bonding, solder bonding or polymer bonding.

Features of the transmissive layers 24 and 220 in this embodiment is that it must be optically transmissive for the wavelengths used in the system in the range from deep UV to far IR, e.g. 250 nanometers to 2000 nanometers and have a well-controlled thickness typically in the range 50-2000 micrometer, preferably 300-500 micrometer.

According to a variant of the invention, the layer 24 may be non-transmissive as such but provided with a for the purpose suitable through-hole for each light channel of the optical MEMS device.

Figure 2B:
Figure 2B:
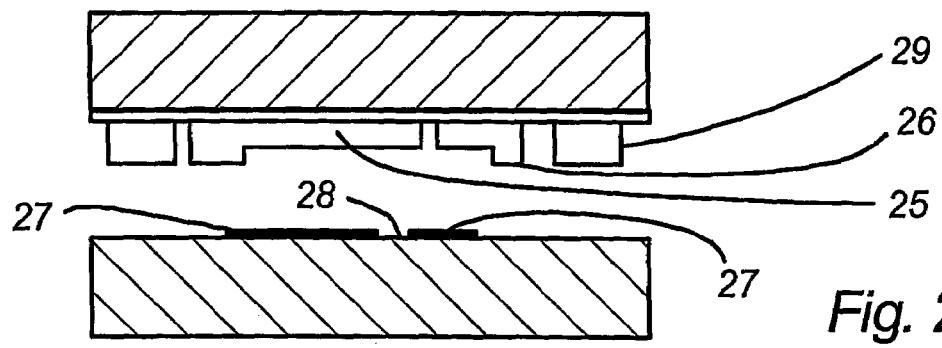

In FIG. 2B, the device layer 23 of the initial SOI wafer 20 of FIG. 2A has been etched by means of a well-known etching process and the contours of mechanical structures 25, 26, 29 has been formed in the device layer. Still, it is noted that the etching has been performed simply by applying etching masks in an appropriate number of etching steps and the mechanical structures 25, 26, 29 are still an inherent part of the device layer 23. The mechanical structures are in this embodiment the structures needed as electrical conductors and for mechanical part of the final structures, although the intended use and purpose of the mechanical parts differ. The movable structure may e.g. comprise an actuator, such as a shutter device. This will be described subsequently.

Moreover, the transmissive layer 24 has been provided with electrical conductors 27 in a certain desired topology. The electrically conductive layer or multi layers on substrate 24 may e.g. preferably comprise aluminum (Al) or alternatively for example gold (Au), silver (Ag), chromium (Cr), Cr/Au, Cr/Au/Al, Al/Au multilayers. The thickness may e.g. range from 50 nanometers to 3000 nanometers. Preferably a thickness of about 500 nanometers is used for electrical connections. The electrically conductive layer 27 may also be applied as a non-transmissive layer for the purpose of defining certain optical patterns of optically non-transmissive patterns on the layer 24. This pattern may specifically define an optical transmission opening 28 on the transmissive layer 24.

Figure 2C:
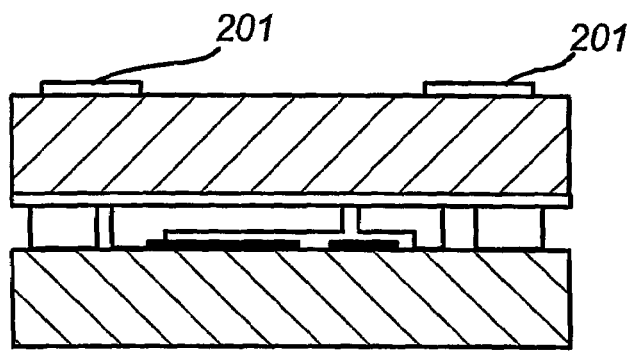

In FIG. 2C, the two parts, basically the structure formed in the origin SOI-wafer 20 and the transmissive layer 24 based structure is mutually joined by for example bonding. A preferred bonding method is anodic bonding. If other layer substrates were used, several alternative bonding methods may be applied within the scope of the invention, Other bonding techniques may be applied, such as eutectic bonding, glass fritt bonding, solder bonding or polymer bonding.

Effectively, the bonding results in that the combined structure of FIG. 2C comprises an inherent device structure formed by the device parts 25, 26 and 29 encapsulated in the applied substrate layers. Furthermore electrical contracts may be established between any device layer structure 25, 26, 29 and the electrical conductors 27 of the base layer.

Moreover, the structure has been provided with a temporary mask 201. The mask 201 is applied for the purpose of masking out the areas not to be etched during the further below-described etching of the handle layer 21. The temporary layer 201 is preferably a photo resistant material of sufficient thickness, e.g. 15 micrometers. An alternative material is e.g. silicon oxide, when the handle layer 21 is silicon.

Figure 2D:
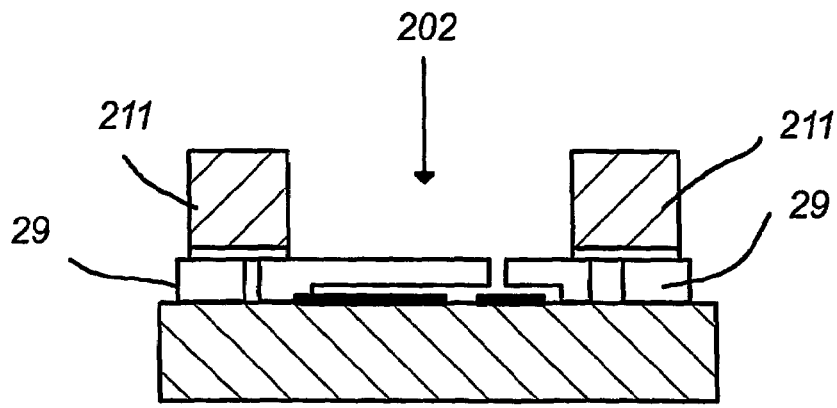

In FIG. 2D, an etching process or other material reduction techniques such as ion milling or laser drilling has resulted in the forming of a hole 202 having a cross-section defined by the mask layer 201. The hole 202 extends to the top of the mechanical structures 25, 26. In this way, the illustrated structure, e.g. a shutter 25 and an electrode 26 are now formed as a partly movable structure. Moreover, and very significantly, the sidewalls of the holes 211, in this case forming a "hole plate" is now defining a very precise and well-defined distance between the "base plate", here the transmissive layer 24.

Figure 2E:
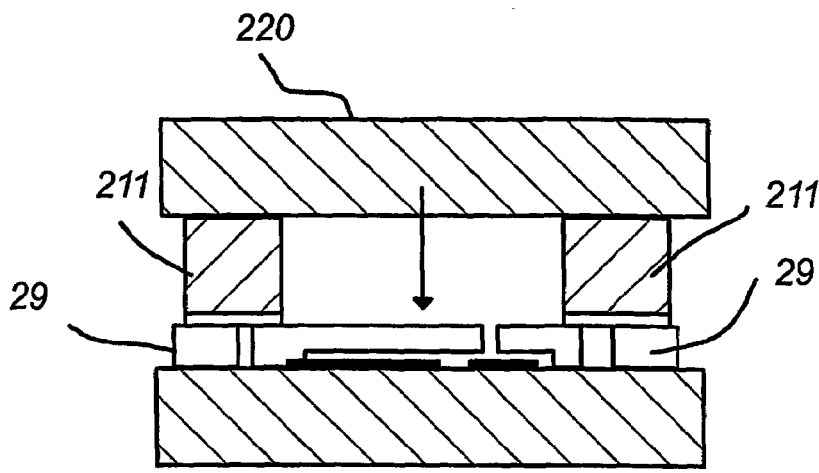

In FIG. 2E, the structure has been provided with a optically transmissive top layer 220 and it may be realized that the distance between the two transmissive layers 220 and 24 are now well defined by the thickness of the initial layers 21, 22 and 23. In other words, the tolerances are defined by the quality of the layers 21, 22 and 23.

The well-defined extensions of the hole 202 over the complete shutter structure, comprising one or several of the illustrated microstructures, e.g. microshutters, are very important when dealing with light transmission systems where light is transmitted through the structure e.g. from above or below through the opening 28 and modulated by means of the electrically controlled shutter structure. Antireflection coating may be deposited on the opening 28.

The hole 202 in the intermediate layer structure must be large enough to fully uncover movable parts of the device layer 23 and it must be large enough not to block the transmitted light in one or more of the associated shutters' open position. In other words, several hole geometries may be applied within the scope of the invention. Preferably, the sidewall profile is vertical +/−10 degrees. Other profiles are also possible if needed within the scope of the invention. An advantageous feature of the invention is that the sidewall profile is not critical, which means that the etching of the hole can be optimized for etch speed and thereby minimizing the manufacturing costs.

Typically, the transmissive layers 220, 24 should comprise micro lens structures applied on one or both sides for optimizing the transmission of light through the opening 28.

Moreover, by applying this unitary layer structure between the transmissive layer 24, 200 a mechanically stable structure has been obtained compared to conventional structures where the layers are separated by conventional few point suspensions by means of surrounding distinct spacers e.g. in the form of so-called spacer glue.

Moreover, a structure has been obtained facilitating a relatively easy sealing of the shutter package. In other words, optimally, the sealing may eventually in certain circumstances be obtained by the mere bonding between the layers of the structure encapsulated between the transmissive layers 220 and 24.

Figure 3:
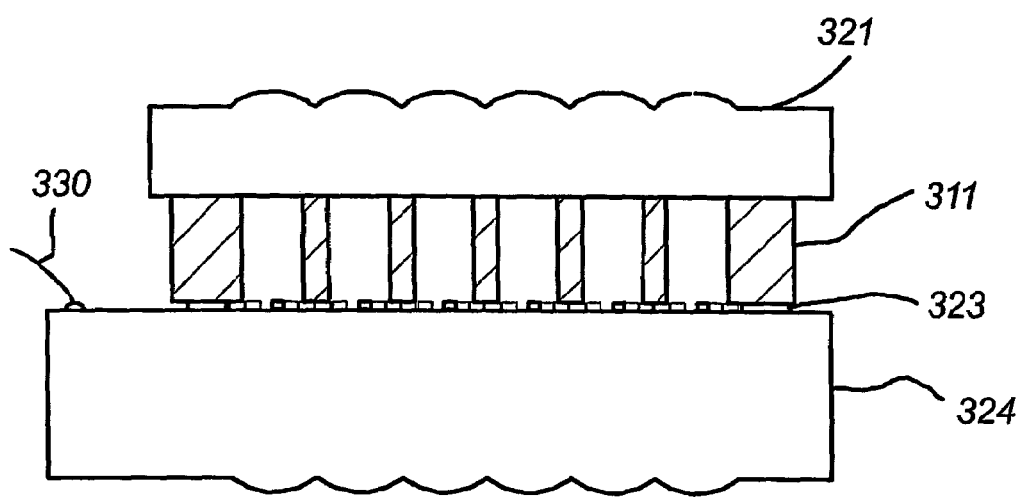

FIG. 3 illustrates an optical MEMS device comprising a plurality of e.g. the microshutter illustrated in FIG. 2E, in this case having micro lens structures on one side of both transmissive layers 321, 324.

The illustrated device moreover comprises a so-called I/O pad wire system 330 adapted for electronic control of the actuators.

Figure 4:
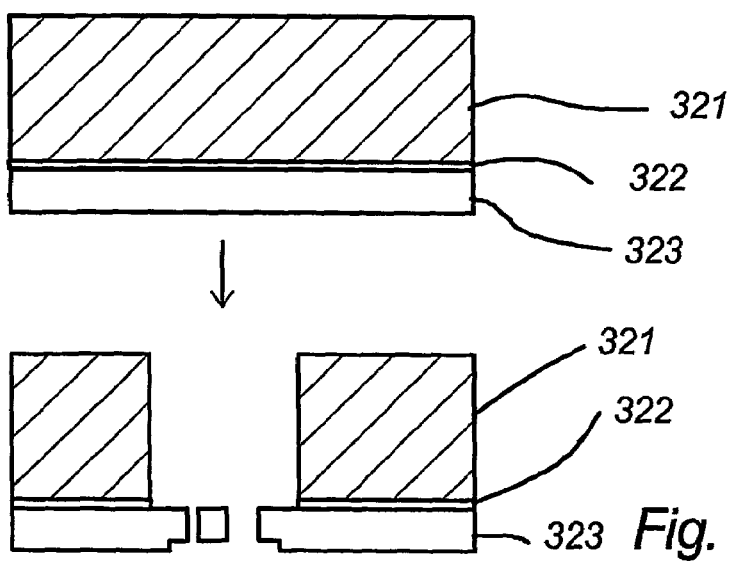

FIG. 4 illustrates the cross-section of the basic structures of a microshutter according to the invention. The illustrated optical MEMS device is manufactured by e.g. an SOI device and preferably by a variant of the process explained in FIG. 2A to 2E.

The initial SOI wafer comprises a handle wafer 321, an insulation layer 322 and a device layer 323.

The illustrated end-structure is typically combined with further structures, e.g. an upper and a lower optically transmissive layer.

It is noted that the basic layers 321, 322, 323 of the illustrated structure features a very well-defined thickness and a very close support to further MEMS layers, e.g. an optically transmissive layer arranged on top and below the structure.

Figure 5:
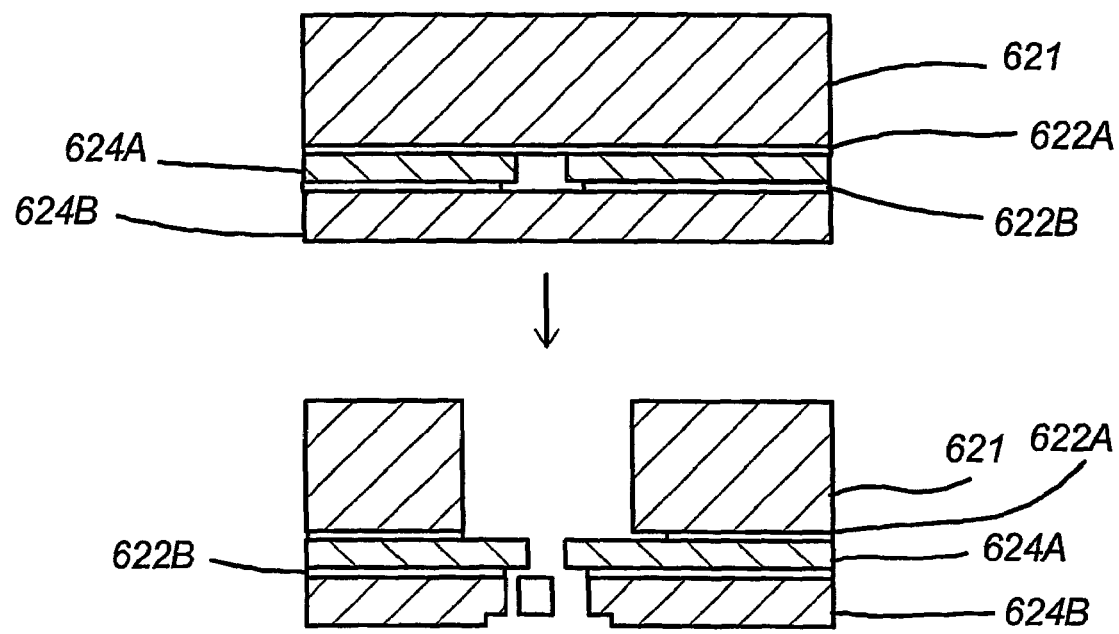

FIG. 5 illustrates a further embodiment of the invention. The illustrated structure, although very complicated in the manufacturing comprises two device layers 624A and 624B mutually separated by an insulating layer 622B and separated from the handle wafer by the by the insulating layer 622A.

The illustrated structure features well-defined structure thickness with respect to further MEMS layers, e.g. top and bottom lens layers.

Figure 6:
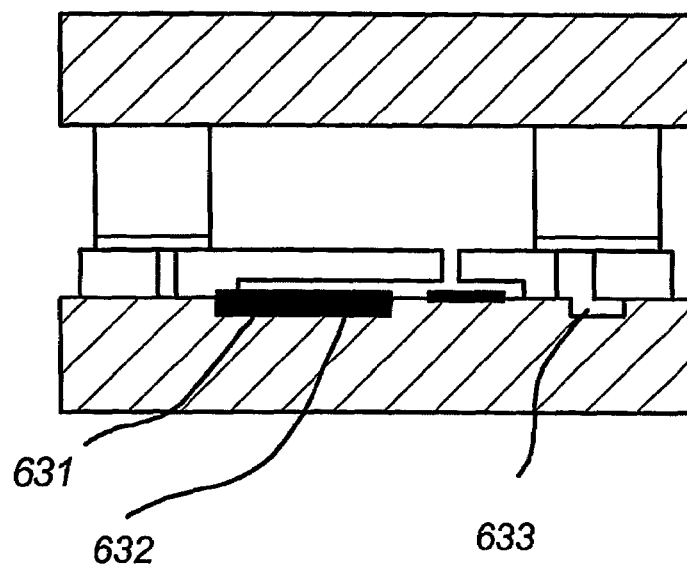

FIG. 6 illustrates a further variant of the invention, basically corresponding to the MEMS device of FIG. 2E but now provided with further cavities 631, 633.

The cavities may e.g. be applied for holding and guiding of leads, electrodes or other device structures.

In the illustrated embodiment, the electrode 632 has now been lowered into the cavity, 631, thereby for example facilitating an increased thickness of the electrode.

Figure 7:
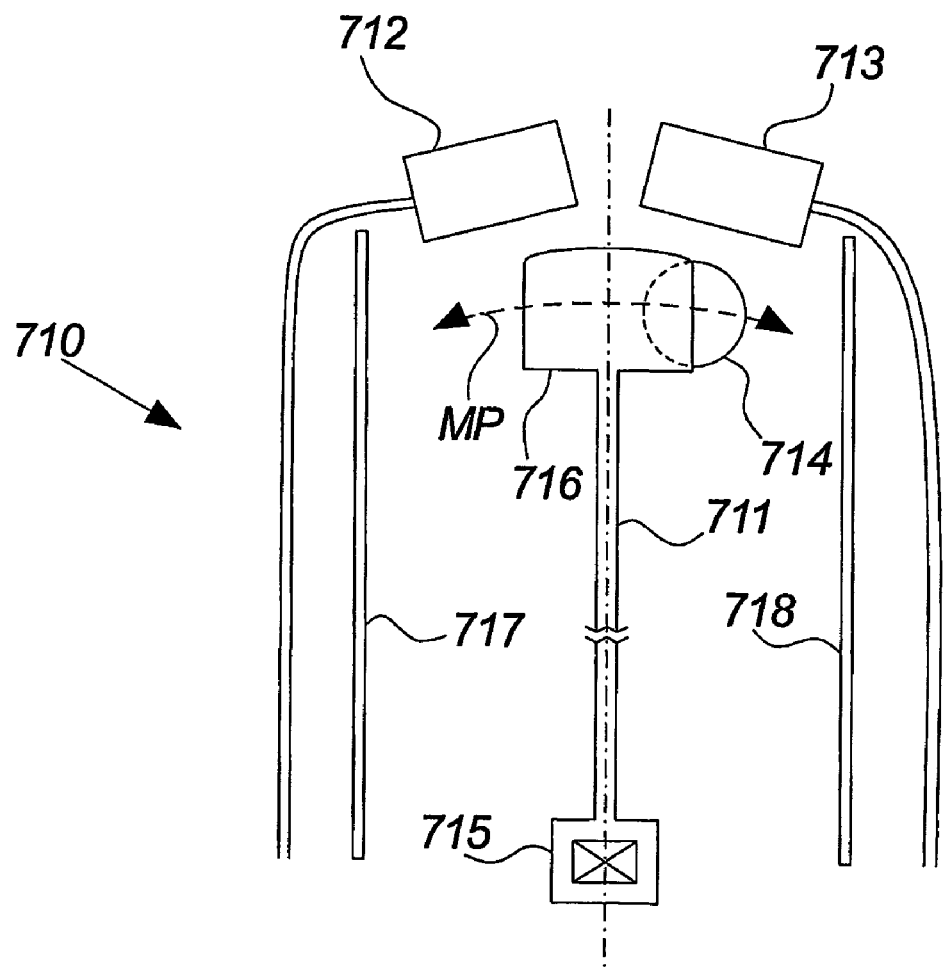

FIG. 7 illustrates an example of one of many applicable micro shutter designs, which may be applied as an actuator in any of the previously described embodiments of the invention.

The illustrated shutter comprises a number of shutter components anchored to a translucent shutter platform, e.g. a base layer.

An optical transmission path for guiding light through the base layer is partly defined by a hole 714 in a masking deposited on the translucent base layer. The light may also include invisible light, e.g. heat-wave beams or UV-light.

The illustrated main component comprises electrodes 712, 713, both fastened to the base layer.

A shutter beam 711 is anchored to the platform at a fastening point 715 at the one end and fitted with a shutter blade 716 at the other end. The shutter blade may be moved relatively to the light transmission path defined by the hole masking 714 by activation of the individually controllable electrodes 712, 713.

The illustrated shutter blade 716 is electrically connected to a feeding line via the anchoring 715 and may move along a path MP defined by the anchoring and the structure of the moving parts.

The moving parts of the shutter, e.g. the blade, are electromagnetically shielded from the feeding lines to electrodes by connecting the shielding 717, 718 to the electrical potential of the moving parts.

The described shutter parts, e.g. moving parts and electrodes may be etched in a device layer attached to a base layer as described e.g. with reference to FIG. 2A to 2E.

Generally, it is noted that the thickness of the plane layers, e.g. IL, DL, are very well-defined, thereby obtaining a well-defined mutual distance of the elements in the joining of the plane layers of the transmissive substrates. These distances are carefully adjusted so to ensure an optimal transmission quality when the shutters are open.

The invention claimed is:

1. An optical microelectromechanical structure (MEMS) comprising:
   (i) at least one optically transmissive layer (UTL);
   (ii) at least one intermediate layer structure (IL);
   (iii) at least one device layer (DL);
   (iv) a base layer (BL); and
   (v) a sealed package
wherein the intermediate layer structure (IL) facilitates one or more optical paths (OP) between the optically transmissive layer (UTL) and base layer and wherein the intermediate structure layer (IL) defines a distance (d) between the optically transmissive layer (UTL) and the device layer (DL) within a range of 10-1000 micrometers and wherein the optical paths (OP) for guiding light through the base layer are partly defined by a plurality of holes in a masking deposited on the base layer (BL).

2. The optical microelectromechanical structure (MEMS) according to claim 1, wherein the intermediate layer structure (IL) comprises at least one electrically insulating layer having a thickness in the range 0.1-3 micrometers.

3. The optical microelectromechanical structure (MEMS) according to claim 1, wherein the intermediate layer structure (IL) comprises a plurality of sub-layers.

4. The optical microelectromechanical structure (MEMS) according to claim 3, wherein at least one of the sub-layers comprises an electrically insulating layer.

5. The optical microelectromechanical structure (MEMS) according to claim 1, wherein the intermediate layer structure (IL) comprises one unitary layer structure.

6. The optical microelectromechanical structure (MEMS) according to claim 5, wherein the unitary layer structure comprises a plate structure having at least one opening means forming part of the one or more optical paths (OP).

7. The optical microelectromechanical structure (MEMS) according to claim 6, wherein the at least one opening means comprises one opening forming part of the optical paths (OP).

8. The optical microelectromechanical structure (MEMS) according to claim 6, wherein the at least one opening means comprises a plurality of apertures (AP).

9. The optical microelectromechanical structure (MEMS) according to claim 6, wherein the at least one opening means comprises a plurality of apertures (AP) each forming part of one individual optical path (OP).

10. The optical microelectromechanical structure (MEMS) according to claim 1, wherein the intermediate layer structure (IL) comprises a plurality of layer structures.

11. The optical microelectromechanical structure (MEMS) according to claim 10, wherein the plurality of layer structures comprise columns.

12. The optical microelectromechanical structure (MEMS) according to claim 1, wherein the device layer (DL) is attached to the base layer (BL).

13. The optical microelectromechanical structure (MEMS) according to claim 1, wherein the extent of the shortest individual optical paths (OP) between the optically transmissive layer (UTL) and the device layer (DL) equals the thickness of the intermediate layer structure (IL).

14. The optical microelectromechanical structure (MEMS) according to claim 12, wherein the extent of the said shortest individual optical paths (OP) between the optically transmissive layer (UTL) and the base layer (BL) equals the thickness of the combined intermediate layer structure (IL) and the device layer (DL) in combination.

15. The optical microelectromechanical structure (MEMS) according to claim 12, wherein the base layer (BL) is optically transmissive.

16. The optical microelectromechanical structure (MEMS) according to claim 1, wherein the device layer (DL) comprises movable parts of actuators.

17. The optical microelectromechanical structure (MEMS) according to claim 1, wherein the intermediate layer structure (IL) comprises a handle layer and an insulating layer of a SOI wafer.

18. The optical microelectromechanical structure (MEMS) according to claim 1, wherein the optically transmissive layer (UTL) comprises micro lenses.

19. The optical microelectromechanical structure (MEMS) according to claim 12, wherein the base layer (BL) comprises micro lenses.

20. The optical microelectromechanical structure (MEMS) according to claim 1, wherein the optically transmissive layer, intermediate layer structure, device layer and base layer are mutually joined.

21. The optical microelectrochemical structure (MEMS) according to claim 1, wherein the optically transmissive layer, intermediate layer structure and device layer are plane layers.

22. The optical microelectromechanical structure (MEMS) according to claim 1, wherein the intermediate layer structure (IL) comprises silicon oxide, silica, quartz, glass, aluminum, sapphire, silicon, nickel, PMMA and/or combinations thereof 23. The optical microelectromechanical structure (MEMS) according to claim 1, wherein the optically transmissive layer (UTL) comprises Pyrex glass, quartz, silica, aluminum, sapphire, silicon, PMMA and/or combinations thereof.

24. The optical microelectromechanical structure (MEMS) according to claim 1, wherein the device layer (DL) comprises silicon of any doping or nickel.

25. The optical microelectromechanical structure (MEMS) according to claim 3, wherein the electrically insulating layer comprises silica, quartz, glass, aluminum, sapphire, silicon nitride, PMMA and/or combinations thereof.

26. The optical microelectromechanical structure (MEMS) according to claim 1, further comprising at least one light modulator arrangement and electrical connections, wherein the light modulator arrangement includes at least one movable microshutter having at least one open and at least one closed position and wherein the at least one optical path guides light through the optical MEMS structure via the at least one light modulator arrangement, and wherein the electrical connections are adapted for transmission of electrical control signal to and optionally from the at least one light modulator arrangement.

27. The optical microelectromechanical structure (MEMS) according to claim 26, wherein light transmitted in the at least one optical path (OP) is focused in or in the vicinity of a shutter plane of the light modulator arrangement.

28. A method of manufacturing an optical microelectromechanical structure (MEMS) by bonding at least one optically transmissive layer with at least one intermediate layer structure (IL), at least one device layer (DL), and a base layer (BL) to form a sealed package, whereby optical transmission is facilitated between the optically transmissive layer (UTL) and the base layer by a plurality of holes in a masking deposited on the base layer (BL) and whereby the distance between the transmissive layer (UTL) and the device layer (DL) is defined by the thickness of the intermediate layer structure within a range of 10-1000 micrometers.

29. The method according to claim 28, whereby structural parts of the MEMS are formed by etching the device layer (DL).

30. The method according to claim 29, whereby the intermediate layer structure (IL) further comprises at least one electrically insulating layer having a thickness in the range of 0.1-3 micrometers and whereby a lossless transmission of light is facilitated between the optically transmissive layer and device layer (DL) by removal of at least a part of the intermediate layer structure (IL).

31. The method according to claim 30, whereby the removal is performed by etching of the intermediate layer structure (IL).

32. The method according to claim 28, whereby the optically transmissive layer, intermediate structure layer, device layer and base layer are mutually joined.

* * * * *